(12) United States Patent
Lee (10) Patent No.: US 6,723,589 B2
(45) Date of Patent: Apr. 20, 2004

(54) METHOD OF MANUFACTURING THIN FILM TRANSISTOR IN SEMICONDUCTOR DEVICE

(75) Inventor: Ga Won Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 66 days.

(21) Appl. No.: 10/026,956

(22) Filed: Dec. 27, 2001

(65) Prior Publication Data

US 2002/0197794 A1 Dec. 26, 2002

(30) Foreign Application Priority Data

Jun. 21, 2001 (KR) ......................................... 2001-35567

(51) Int. Cl.[7] ............................................. H01L 21/84
(52) U.S. Cl. ........................ 438/155; 438/152; 257/66; 257/67
(58) Field of Search ............................ 257/66, 67, 69, 257/70, 903, 904, 393, 381; 438/149, 151, 152, 157, 166, 153, 155, 279, 238; 365/156, 49

(56) References Cited

U.S. PATENT DOCUMENTS

| | | | |
|---|---|---|---|
| 5,156,987 A | * 10/1992 | Sandhu et al. | 438/153 |
| 5,404,030 A | * 4/1995 | Kim et al. | 257/69 |
| 6,022,766 A | * 2/2000 | Chen et al. | 438/152 |
| 6,133,586 A | * 10/2000 | Ohkubo | 257/66 |
| 6,232,195 B1 | * 5/2001 | Yang | 438/384 |
| 6,271,542 B1 | * 8/2001 | Emma et al. | 257/67 |
| 6,303,966 B1 | * 10/2001 | Park | 257/903 |

FOREIGN PATENT DOCUMENTS

JP           05-160371         * 6/1993 ............... 27/11

* cited by examiner

*Primary Examiner*—Shouxiang Hu
*Assistant Examiner*—Quang Vu
(74) *Attorney, Agent, or Firm*—Morgan, Lewis & Bockius LLP

(57) ABSTRACT

The present invention relates to a method of manufacturing a thin film transistor in a semiconductor device. The present invention forms a single crystal silicon thin film on an interlayer insulating film on a single crystal driver transistor using a solid phase crystallization of amorphous silicon, forms a single crystal silicon thin film transistor (C—Si TFT) in the single crystal silicon thin film in order to uses it as a load transistor and uses a contact plug connecting a drain in the driver transistor and a drain in the load transistor as a SPC (solid phase crystallization) plug, in a process of depositing a silicon thin film on a single crystal transistor by a three-dimensional stack process to deposit to form a load transistor in a manufacture process of SRAM. Therefore, the present invention can improve the uniformity and reliability of the load transistor.

4 Claims, 6 Drawing Sheets

METHOD OF MANUFACTURING THIN FILM TRANSISTOR IN SEMICONDUCTOR DEVICE

BACKGROUND OF THE INVENTION

1. Field of the Invention

The invention relates generally to a method of manufacturing a thin film transistor in a semiconductor device, and more particularly to, a method of manufacturing a thin film transistor in a semiconductor device using a three-dimensional stack process by which a silicon thin film is deposited on a single crystal driver transistor to form a load transistor in a SRAM manufacture process.

2. Description of the Prior Art

Recently, as notebook computers and PDA (personal digital assistant) gain popularity, there is a great demand for random access memory (RAM) having a low power, a high speed and a high integration. DRAM can be highly integrated but has a low speed. SRAM is difficult to be higher integrated since it requires a large cell area. In order to reduce the cell area, SRAM is made using a three-dimensional stack process by which a silicon thin film is deposited on a single crystal driver transistor to form a load transistor. From 16 Kb SRAM, a polysilicon load resistor cell has been used as a standard memory cell of a versatile SRAM. A TFT type cell using a PMOS polysilicon thin film transistor has been adopted from 4 Mb. If the TFT type cell is used, there are advantages that the consumption current can be kept below 1 µA upon data hold and it is strong to a soft error that is frequently generated at a high operation. Specially, there is an advantage that the size of the cell can be smaller than using a conventional polysilicon load resistor by means of a stacking technology. The polysilicon thin film transistor currently used, however, has problems that the device characteristic is irregular and reliability is low due to a crystal boundary irregularly existing in the polysilicon thin film This is because that the crystal boundary is irregularly formed in an active region of a transistor. As the device is scaled down, an effect by random crystal boundary is severe and the throughout is thus degraded, which is further fatal as the integration level of the memory becomes high. It is most preferable that the single crystal silicon device is used as the load transistor. Though it is difficult to manufacture the single crystal silicon stack load transistor using a current technology, a structure in which 6 transistors are manufactured on one plane has been adopted.

Another problem in the polysilicon silicon transistor is that the substrate is floated. In this case, holes formed by the junction leakage current are accumulated on the substrate to raise the potential of the body, which increases the sub-threshold leakage current. Due to this, there is a problem that the stand-by power is increased.

SUMMARY OF THE INVENTION

The present invention is contrived to solve the problems and an object of the present invention is to provide a method of manufacturing a thin film transistor in a semiconductor device capable of increasing the uniformity and reliability of a load transistor, in a way that a single crystal silicon thin film is formed on an interlayer insulating film over a single crystal driver transistor using solid phase crystallization of amorphous silicon, a single crystal silicon thin film transistor (C—Si TFT) as a load transistor is formed in the single crystal silicon thin film, and a contact plug connecting a drain of the driver transistor and a drain of the load transistor is used as a solid phase crystallization (SPC) plug.

In order to accomplish the above object, a method of manufacturing a thin film transistor in a semiconductor device according to the present invention, is characterized in that it comprises the steps of forming a plurality of access transistors and driver transistors in a semiconductor substrate and then an interlayer insulating film on the entire structure; forming a gate of a give pattern on the interlayer insulating film and then forming a gate oxide film on the entire structure; etching given regions of the gate oxide film and the interlayer insulating film to expose drains in the driver transistors; forming an amorphous silicon thin film on the entire structure; solid-phase crystallizing the amorphous silicon thin film by means of annealing process to form a single crystal silicon thin film; and implanting an impurity into a given region except for the single crystal silicon thin film on the gate to form source/drain.

Also, a method of manufacturing a thin film transistor in a semiconductor device according to the present invention, is characterized in that it comprises the steps of forming a plurality of junction regions, access transistors and driver transistors in a semiconductor substrate and then an interlayer insulating film on the entire structure; etching given regions of the gate oxide film and the interlayer insulating film to expose the junction regions and a drain in the driver transistor; forming an amorphous silicon thin film on the entire structure; solid-phase crystallizing the amorphous silicon thin film by means of annealing process to form a single crystal silicon thin film; forming a gate oxide film and a gate of a given pattern on the single crystal silicon thin film on the junction regions; and forming source/drain in the single crystal silicon thin film through impurity ion implantation process using the gate as an ion implantation mask.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
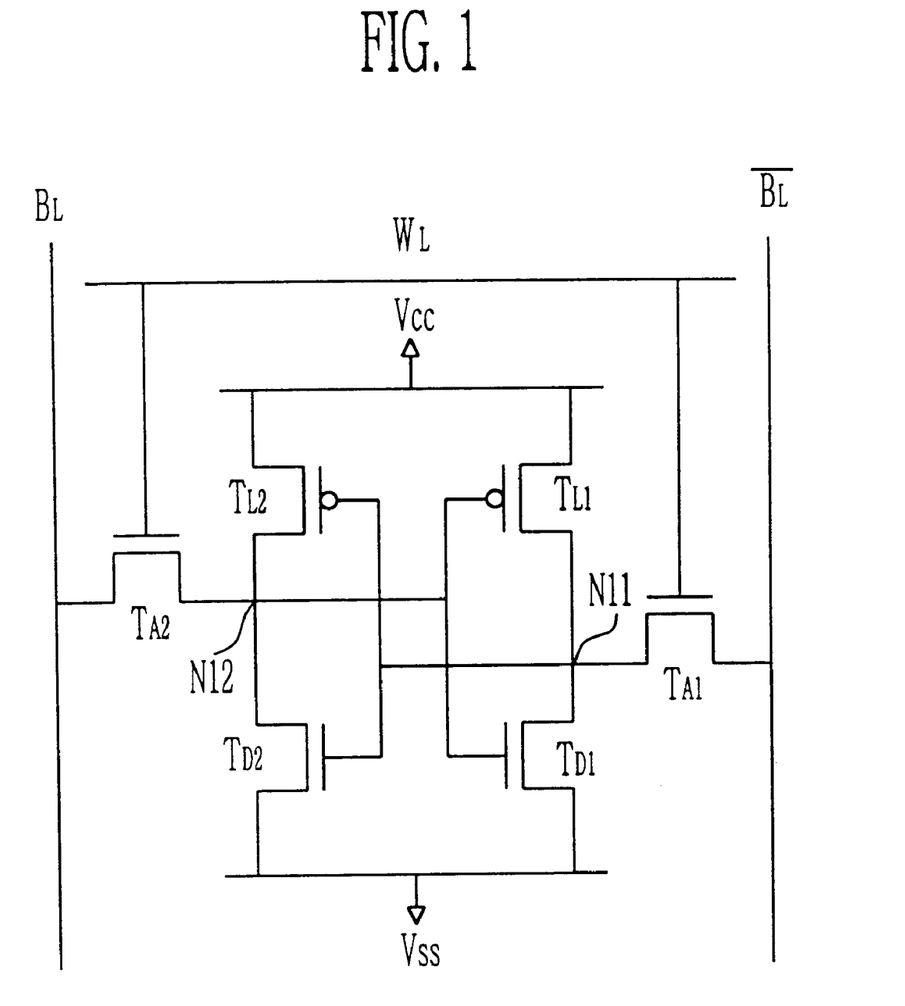
FIG. 1 is a circuit diagram for explaining a structure of SRAM.

Referring now to FIG. 1, there is shown a circuit diagram for explaining a structure of SRAM.

An unit cell of the SRAM includes a first load transistor $T_{L1}$ a gate terminal of which is connected to a second node N12, connected between a power supply voltage terminal Vcc and a first node N11; a first driver transistor $T_{D1}$ a gate terminal of which is connected to the second node N12, connected between a first node N11 and a ground voltage terminal Vss; a second load transistor $T_{L2}$ a gate terminal of which is connected to the first node N11, connected between the power supply voltage terminal Vcc and the second node N12; a second driver transistor $T_{D2}$ a gate terminal of which is connected to the first node N11, connected between the second node N12 and the ground voltage terminal Vss; a first access transistor $T_{A1}$ a word line terminal $W_L$ of which is connected to the gate terminal, connected between the first node N11 and the inverse bit line terminal/$B_L$; and a second access transistor $T_{A2}$ a word line terminal $W_L$ of which is connected to the gate terminal, connected between the second node N12 and a non-inverse bit line terminal $B_L$.

In the process of manufacturing the unit cell of the SRAM consisting of the above elements, the first load transistor $T_{L1}$ is formed on the first driver transistor $T_{D1}$ and the second load transistor $T_{L2}$ is formed on the second driver transistor $T_{D2}$.

Explaining in more detail, in order to form the load transistor on the driver transistor, it is required that the single crystal silicon thin film for forming a channel region and source/drain of the load transistor be formed on an insulating film formed on the entire surface including the driver transistor.

A first embodiment of forming a single crystal silicon thin film on an interlayer insulating film will be below described by reference to FIGS. 2A~2D.

Figure 2A:
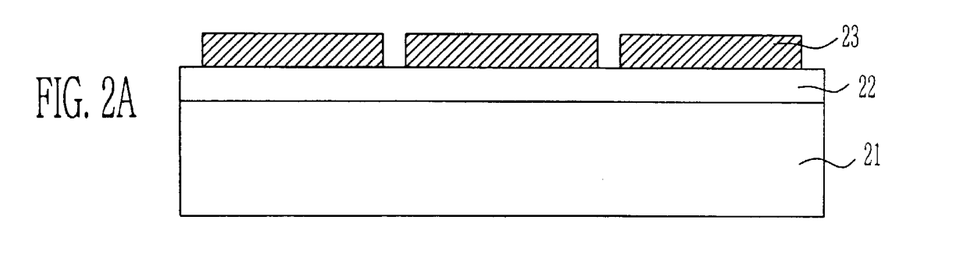
FIGS. 2A~2D are cross-sectional views of a semiconductor device for explaining a method of forming a single crystal silicon thin film according to a first embodiment of the present invention.

Referring now to FIG. 2A, an interlayer insulating film 22 is formed on the entire surface of a semiconductor substrate 21 in which various components (not shown) are formed by means of a given process. Then, a photoresist pattern 23 of a given pattern is formed on the interlayer insulating film 22.

Figure 2B:
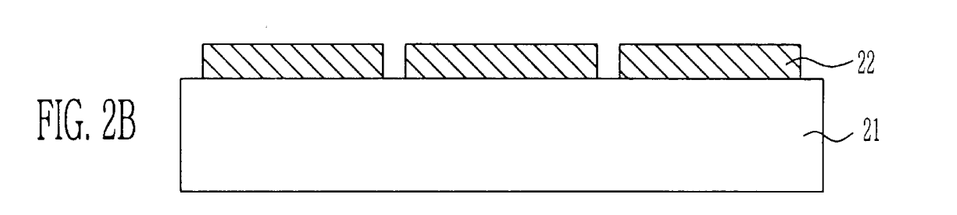

By reference to FIG. 2B, an exposed portion of the interlayer insulating film 22 is removed by an etch process using the photoresist pattern 23 as an etch mask. Next, the photoresist pattern is removed, which thus exposing a given region of the semiconductor substrate 21.

Figure 2C:
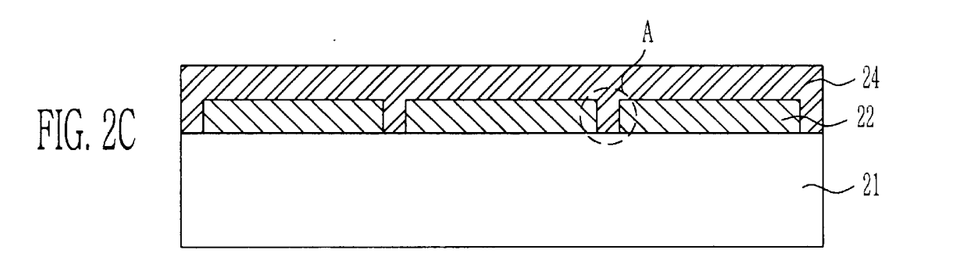

Referring now to FIG. 2C, an amorphous silicon thin film 24 is formed on the interlayer insulating film 22 including the exposed surface of the semiconductor substrate 21. Then, an upper surface of the amorphous silicon thin film 24 is flattened by means of a planarization process such as chemical mechanical polishing.

The amorphous silicon thin film 24 and the semiconductor substrate 21 come in contact by an amorphous silicon pole A in a region where the interlayer insulating film 22 is removed.

Figure 2D:
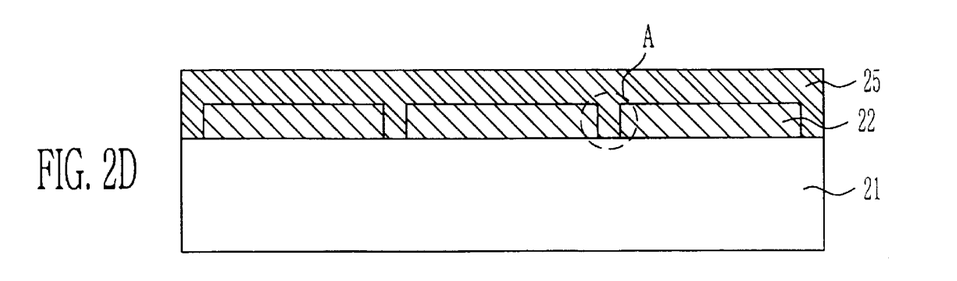

By reference to FIG. 2D, solid phase crystallization (SPC) of the amorphous silicon thin film is facilitated by a given annealing process to form a single crystal silicon thin film 25 on the interlayer insulating film 22.

A method of forming the single crystal silicon thin film on the interlayer insulating film according to a second embodiment of the present invention will be described by reference to FIGS. 3A~3E.

Figure 3A:
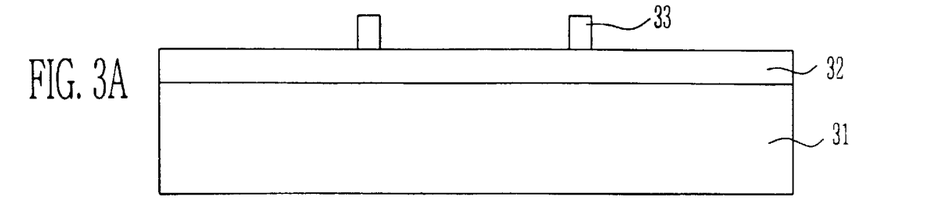
FIGS. 3A~3E are cross-sectional views of a semiconductor device for explaining a method of forming a single crystal silicon thin film according to a second embodiment of the resent invention.

Referring now to FIG. 3A, a first insulating film 32 is formed on a semiconductor substrate 31 in which various components (not shown) are formed, by means of a given process. Then, a photoresist pattern 33 of a given pattern is formed on the first insulating film 32.

Figure 3B:
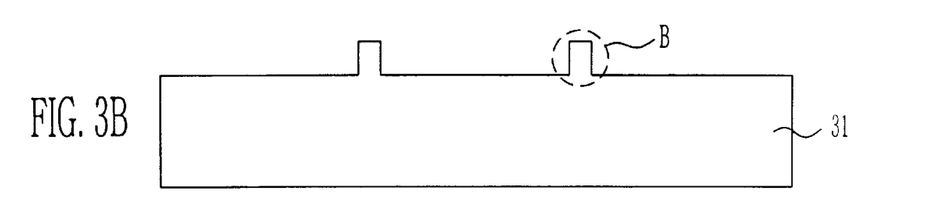

Referring now to FIG. 3B, the first insulating film 32 and the semiconductor substrate 31 are etched by a given depth by means of an etch process using the photoresist pattern 33 as an etch mask. Thereafter, the photoresist pattern and the first insulating film are removed.

By means of the above etch process, a single crystal silicon pole B is formed since a portion of the semiconductor substrate 31 where the photoresist pattern is formed is not etched.

Figure 3C:
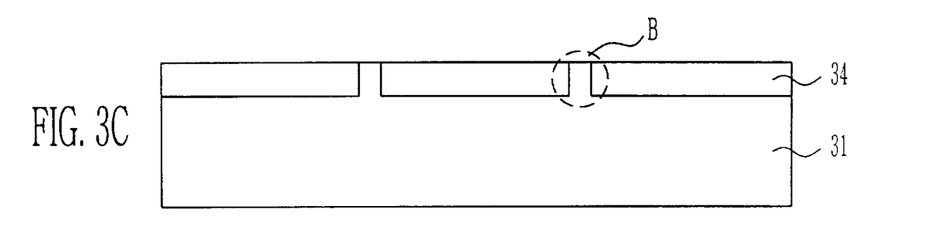

Referring now to FIG. 3C, a second insulating film 34 is formed on the entire surface and is then experienced by a planarization process such chemical mechanical polishing to expose an upper surface of the single crystal silicon pole B. The. Single crystal silicon pole B functions as a plug with an element formed on the second insulating film 34 in a subsequent process and the semiconductor substrate 31.

Figure 3D:
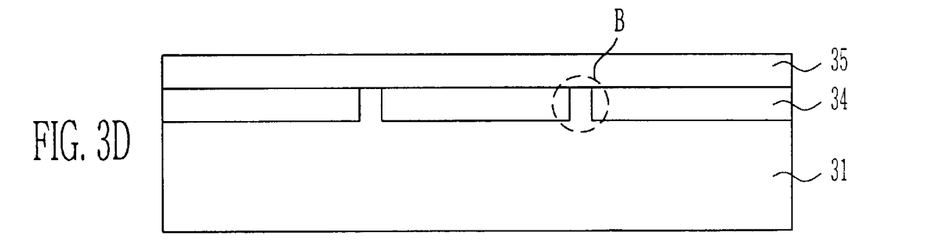

By reference to FIG. 3D, an amorphous silicon thin film 35 is formed on the second insulating film 34 including the single crystal silicon pole B.

Figure 3E:
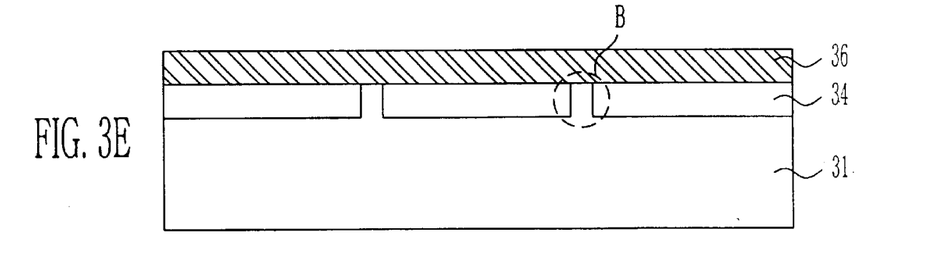

Referring now to FIG. 3E, solid phase crystallization (SPC) of the amorphous silicon thin film is facilitated by means of a given process, thus forming a single crystal silicon thin film 36 on the interlayer insulating film 34.

In a conventional solid phase crystallization, as there is usually an amorphous silicon layer on an insulating film, polysilicon layers having different crystal directions are created after annealing process. In the present invention, however, the amorphous silicon thin film (23 in FIG. 2C or 35 in FIG. 3D) comes in contact with the semiconductor substrate 21 being single crystal silicon by means of the amorphous silicon pole A, as shown in FIG. 2C, or comes in contact with the semiconductor substrate 31 being single crystal silicon by means of the single crystal silicon pole B, as shown in FIG. 3D. As nucleation activation energy is small in the junction interface, crystal is grown using the crystal of the single crystal silicon layer as a seed. In other words, as solid phase crystallization of amorphous silicon is facilitated using single crystal silicon of the junction interface as a seed in the annealing process, the single crystal silicon thin film is formed on the insulating layer. In particular, if the solid phase crystallization is facilitated through a furnace annealing below 600° C., it is advantageous when implementing a three-dimensional stacked structure since there is a little thermal budget with respect to the annealing process.

Hereinafter, a method of manufacturing a thin film transistor in a semiconductor device according to the present invention by which the load transistor is formed on the driver transistor using solid phase crystallization of amorphous silicon, will be described by reference to FIGS. 4A~4F.

Figure 4A:
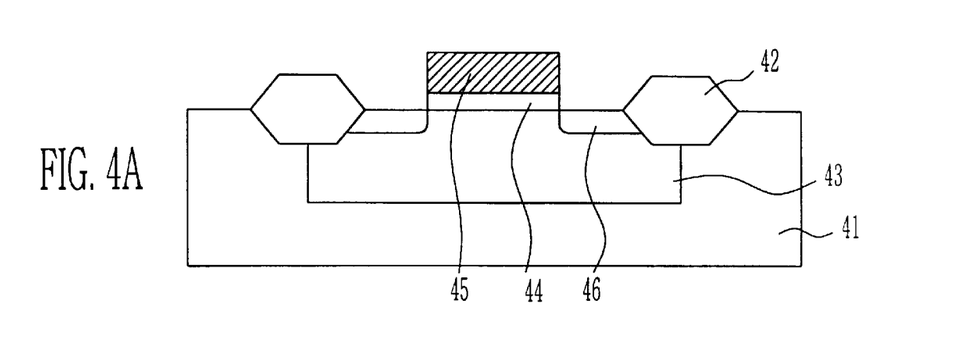
FIGS. 4A~4E are cross-sectional views of a thin film transistor in a semiconductor device for explaining a method of manufacturing the thin film transistor according to one embodiment of the present invention.

Referring now to FIG. 4A, a field oxide film 42 is formed at a given region of a semiconductor substrate 41. Then, a p-well 43 is formed through ion implantation process. Thereafter, a first gate oxide film 44, a first gate 45 and source/drain 46 are formed by means of common process. Thus, a driver transistor consisting of the first gate oxide film 44, the first gate 45 and source/drain 46 is completed.

Figure 4B:
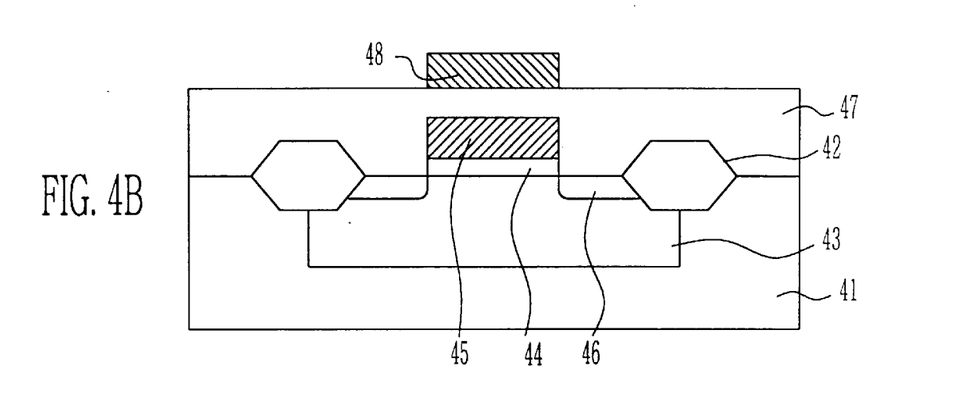

By reference to FIG. 4B, after an interlayer insulating film 47 is formed on the entire surface, a second gate 48 of a given pattern is formed on the interlayer insulating film 47 on the first gate 45.

Figure 4C:
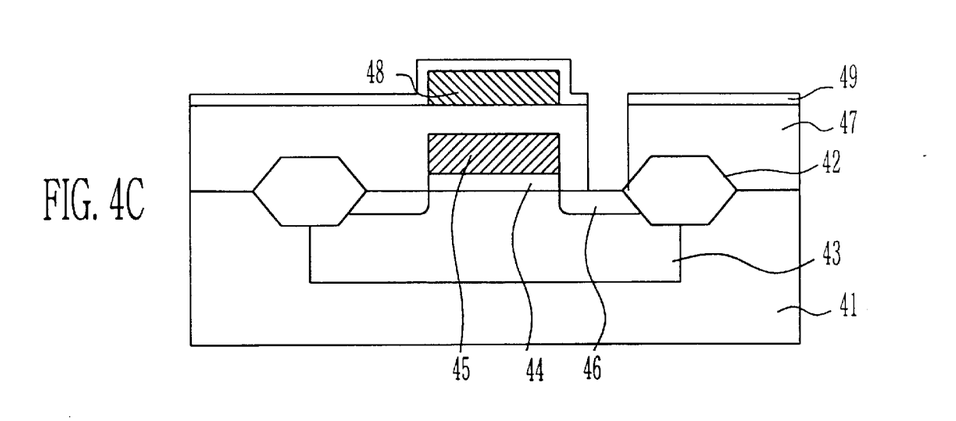

Referring now to FIG. 4C, a second gate oxide film 49 of a thin oxide film is formed on the interlayer insulating film 47 including the second gate 48. The second gate oxide film 49 is uniformly formed on the entire surface 9 so that an upper surface and sidewalls of the second gate 48 are not exposed. Then, given regions of the second gate oxide film 49 and the interlayer insulating film 47 are etched to expose the drain 46.

Figure 4D:
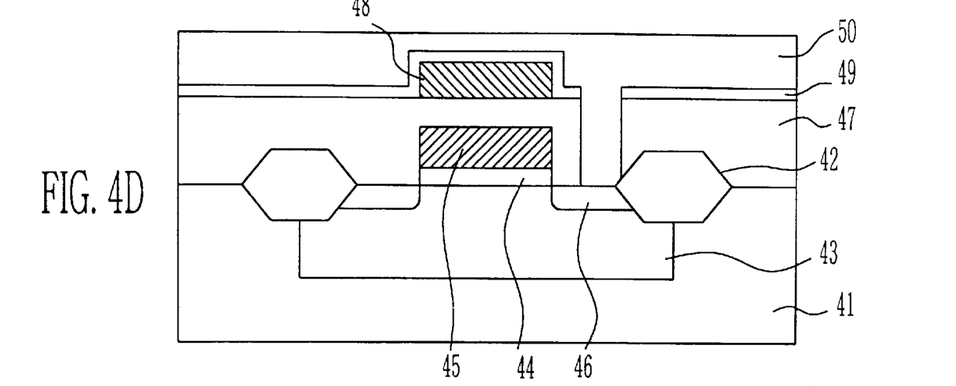

By reference to FIG. 4D, an amorphous silicon thin film 50 is formed on the entire surface including the drain 46 so that the etched region of the interlayer insulating film 47 can be completely buried. Thereafter, a planarization process such as chemical mechanical polishing is implemented to flatten an upper surface of the amorphous silicon thin film 50.

Figure 4E:
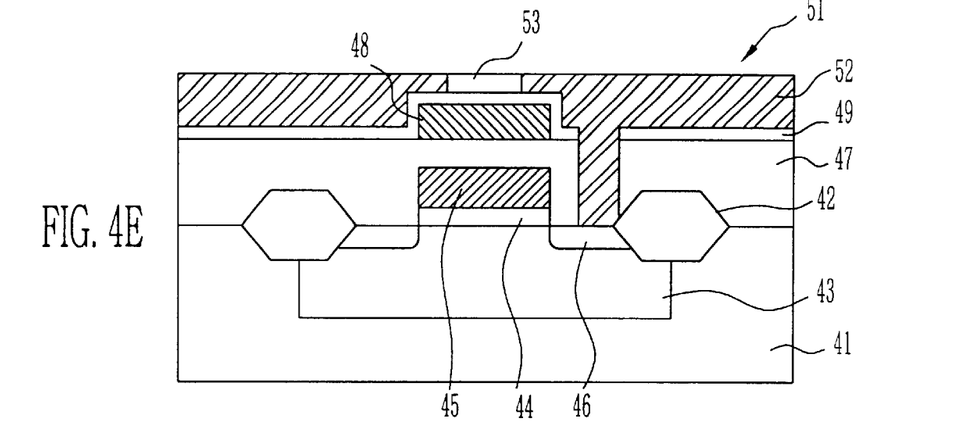

Referring now to FIG. 4E, solid phase crystallization (SPC) of the amorphous silicon thin film is facilitated by means of a given annealing process to form a single crystal silicon thin film 51 using the amorphous silicon thin film.

The annealing process may be performed by means of a low-temperature furnace annealing process below about 600° C. or a laser annealing process having a small thermal load. The low-temperature furnace annealing process or the laser annealing process is advantageous when making a three-dimensional stacked structure.

At this time, the amorphous silicon thin film comes in contact with the drain 46 being single crystal silicon through a region from which the interlayer insulating film 47 is removed by means of an etch process. Also, as solid phase crystallization of the amorphous silicon thin film is facilitated since the single crystal silicon becomes a seed, the amorphous silicon thin film is formed of the single crystal silicon thin film 51.

Thereafter, the photoresist pattern (now shown) is formed on the second gate 48. Then, source/drain 52 is formed at a given region of the single crystal silicon thin film 51 by means of ion implantation process and activation annealing process of an impurity into which ions are injected. After the source/drain 52 is formed, the photoresist pattern is removed.

Figure 4F:
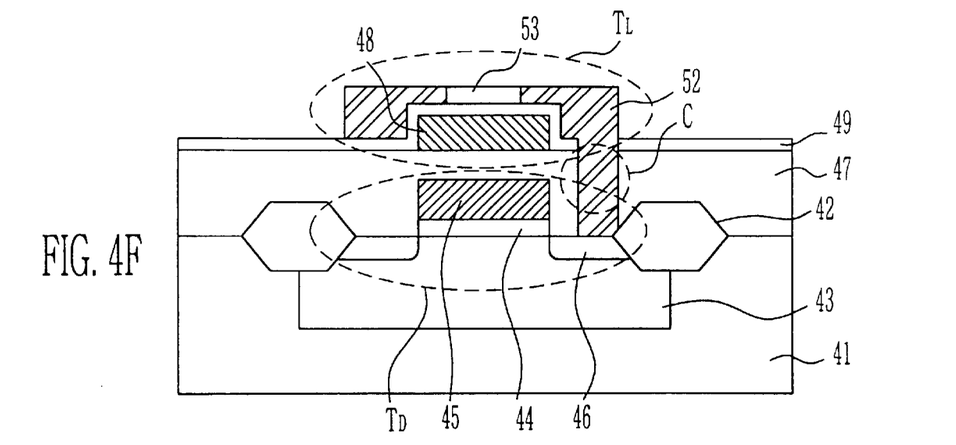

Referring now to FIG. 4F, unnecessary portions of the single crystal silicon thin film 51 is removed by etch process, which is then patterned.

Thereby, the single crystal silicon thin film transistor being the load transistor $T_L$ consisting of the second gate 48, the second gate oxide film 49 and the source/drain 52 is manufactured on the driver transistor $T_D$ consisting of the first gate oxide film 44, the first gate 45 and the source/drain 46. An ion implantation process is not performed with respect to the single crystal silicon thin film 51 on the second gate 48, which becomes the channel region 53 of the load transistor.

The above process is same to a conventional structure using a conventional bottom gate poly-Si thin film transistor as the load transistor and uses a contact plug connecting the drain of the driver transistor and the drain of the load transistor as a solid phase crystallization plug (C in FIG. 4F) for solid-phasing the amorphous silicon thin film being an active layer being the load transistor into a single crystal. Due to this, there is an advantage that the device characteristic can be improved while the conventional process is maintained intact. At this time, as deposition and solid phase crystallization of amorphous silicon are performed at the temperature below 600°C., dopant diffusion is not a significant problem upon annealing.

Figure 5:
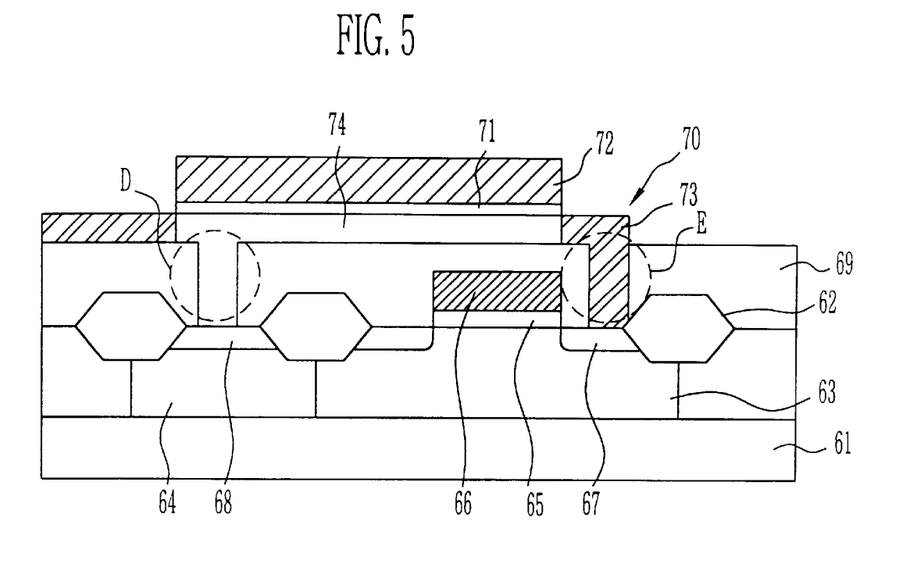
FIG. 5 is a cross-sectional view of a thin film transistor in a semiconductor device for explaining a method of manufacturing the thin film transistor according to another embodiment of the present invention.

Referring now to FIG. 5, a field oxide film 62 is formed in a semiconductor substrate 61, and a p-well 63 and an n-well 64 are formed on the semiconductor substrate 61.

Then, as shown in FIG. 4A, a first gate oxide film 65, a first gate 66 and source/drain 67 are formed by common process to form a driver transistor. At this time, a p-type junction region 68 is formed in the n-well 64. Thereafter, after an interlayer insulating film 69 is formed on the entire surface, a given region of the interlayer insulating film 69 is etched to expose the p-type junction region 68 and the drain 67. Next, an amorphous silicon thin film is formed on the entire surface including the exposed p-type junction region 68 and the drain 67 and is then experienced by annealing process to form a single crystal silicon thin film 70 using the amorphous silicon thin film. The annealing process may be performed by means of a low-temperature furnace annealing process below about 600° C. or a laser annealing process having a less thermal load.

The low-temperature furnace annealing process or the laser annealing process is advantageous when making a three-dimensional stacked structure. A second gate oxide film 71 and a second gate 72 of a given pattern are formed on the single crystal silicon thin film 70 by means of a common process. Thereafter, source/drain 73 is formed in the single crystal silicon thin film 70 using ion implantation process, thus completing a load transistor consisting of the second gate oxide film 71, the second gate 72 and source/drain 73. The single crystal silicon thin film 70 below the second gate 72 becomes a channel region 74 of the load transistor.

In the present invention, the single crystal silicon pole used as a seed is used a body contact of the load transistor. Therefore, the present invention can reduce a sub-threshold current. In other words, in the present invention, a contact plug connecting the drain 67 in the driver transistor and the drain 73 in the load transistor can be used as a SPC plug E and can be used as a SPC plug D after additional n-well 64 for body contact is formed. In this case, the contact plug can be implemented as bottom gate or double gate TFT like a top gate TFT structure or an existing stacked SRAM.

As mentioned above, the present invention forms a single crystal silicon thin film on an interlayer insulating film on a driver transistor using solid phase crystallization of amorphous silicon, forms a single crystal silicon thin film transistor in the single crystal silicon thin film in order to use it as a load transistor, and uses a contact plug connecting a drain in the driver transistor and a drain in the load transistor as a SPC plug. Therefore, the present invention can manufacture a three-dimensional stack SRAM of a high performance and a high integration without loss of the area or additional cost. Further, the present invention can improve the device characteristic by using a body contact of the load transistor even additional area for the SPC plug is made.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a load thin film transistor in a semiconductor device, comprising:

forming a plurality of junction regions, a plurality of access transistors and a plurality of driver transistors in a semiconductor substrate;

forming an interlayer insulating film on the semiconductor substrate including the plurality of access transistors and the plurality of driver transistors;

etching regions of the interlayer insulating film to expose the plurality of junction regions and drains of the plurality of driver transistors;

forming an amorphous silicon thin film on the top surface and etched portions of the interlayer insulating film, the exposed portions of the plurality of junction regions and the drains of the plurality of driver transistors;

solid-phase crystallizing the amorphous silicon thin film by means of an annealing process to form a single crystal silicon thin film;

forming a gate oxide film and a gate on the single crystal silicon thin film; and forming source/drain in the single crystal silicon thin film through an impurity ion implantation process using the gate as an ion implantation mask.

2. The method of manufacturing a load thin film transistor in a semiconductor device as claimed in claim 1, wherein the annealing process is implemented by means of a low temperature furnace annealing below about 600C or a laser annealing.

3. The method of manufacturing a load thin film transistor in a semiconductor device as claimed in claim 1, wherein the amorphous silicon thin film is solid phase crystallized into a single crystal by the annealing process by using a crystal seed.

4. The method of manufacturing a load thin film transistor in a semiconductor device as claimed in claim 1, wherein a portion of the single crystal silicon thin film is used as a body contact plug.

* * * * *